(12) United States Patent
Humphreys et al.

(10) Patent No.: US 9,142,723 B2
(45) Date of Patent: Sep. 22, 2015

(54) SEMICONDUCTOR WAFER COMPRISING GALLIUM NITRIDE LAYER HAVING ONE OR MORE SILICON NITRIDE INTERLAYER THEREIN

(75) Inventors: Colin Humphreys, Cambridge (GB);
Clifford McAleese, Cambridge (GB);
Menno Kappers, Cambridge (GB);
Zhenyu Liu, Cambridge (GB); Dandan Zhu, Cambridge (GB)

(73) Assignee: Intellec Limited, Cambridge (GB)

( * ) Notice: Subject to any disclaimer, the term of this patent is extended or adjusted under 35 U.S.C. 154(b) by 143 days.

(21) Appl. No.: 13/885,346

(22) PCT Filed: Oct. 12, 2011

(86) PCT No.: PCT/GB2011/001474
§ 371 (c)(1),
(2), (4) Date: Jul. 1, 2013

(87) PCT Pub. No.: WO2012/066269
PCT Pub. Date: May 24, 2012

(65) Prior Publication Data
US 2013/0270575 A1    Oct. 17, 2013

(30) Foreign Application Priority Data

Nov. 15, 2010 (GB) .................................. 1019301.9

(51) Int. Cl.
*H01L 29/06* (2006.01)
*H01L 33/32* (2010.01)
(Continued)

(52) U.S. Cl.
CPC ................. *H01L 33/32* (2013.01); *B82Y 20/00* (2013.01); *H01L 21/0242* (2013.01); *H01L 21/0251* (2013.01); *H01L 21/0254* (2013.01); *H01L 21/0262* (2013.01); *H01L 21/02381* (2013.01); *H01L 21/02458* (2013.01); *H01L 21/02488* (2013.01); *H01L 21/02505* (2013.01);

*H01L 21/02573* (2013.01); *H01L 31/03048* (2013.01); *H01L 31/035236* (2013.01); *H01L 31/075* (2013.01); *H01L 31/1852* (2013.01); *H01L 31/1856* (2013.01); *H01L 33/007* (2013.01);
(Continued)

(58) Field of Classification Search
USPC .......................................... 257/12–14, 18, 20
See application file for complete search history.

(56) References Cited

U.S. PATENT DOCUMENTS 5,919,305 A * 7/1999 Solomon ......................... 117/90
6,252,261 B1    6/2001 Usui et al.
(Continued)

FOREIGN PATENT DOCUMENTS

| KR | 200408522 | 2/2006 |
| WO | 2006/014472 | 2/2006 |
| WO | 2007133603 | 11/2007 |

OTHER PUBLICATIONS

Kappers et al., "Interlayer methods for reducing the dislocation density in gallium nitride", Physica B, vols. 401-402, Dec. 15, 2007, pp. 2

Cheng et al., "High quality GaN grown on silicon(111) using a SixNy interlayer by metal-organic vapor phase epitaxy", Appl. Phys. Lett. 92, 192111 (2008); 3 pages. 96-301.
(Continued)

*Primary Examiner* — Matthew E Warren
(74) *Attorney, Agent, or Firm* — Senniger Powers LLP

(57) ABSTRACT

A semiconductor wafer comprising a substrate layer and a first GaN layer having one or more SiNx interlayers therein, wherein in the first GaN layer at least one SiNx interlayer has GaN penetrated through one or more portions of said SiNx interlayer and preferably has a thickness of from 0.5 to 10 nm.

18 Claims, 2 Drawing Sheets

(51) Int. Cl.
  *H01L 21/02*   (2006.01)
  *H01L 31/0304*  (2006.01)
  *H01L 31/0352*  (2006.01)
  *H01L 31/075*   (2012.01)
  *H01L 31/18*    (2006.01)
  *B82Y 20/00*    (2011.01)
  *H01L 33/00*    (2010.01)
  *H01L 33/12*    (2010.01)

(52) U.S. Cl.
  CPC .............. *H01L 33/12* (2013.01); *Y02E 10/544* (2013.01); *Y02E 10/548* (2013.01)

(56) References Cited

U.S. PATENT DOCUMENTS

| | | | |
|---|---|---|---|
| 8,134,168 B2* | 3/2012 | Sakai et al. .................. | 257/94 |
| 2002/0069817 A1* | 6/2002 | Mishra et al. ................ | 117/84 |
| 2006/0073681 A1 | 4/2006 | Han | |
| 2007/0184671 A1 | 8/2007 | Yasuda et al. | |
| 2010/0032650 A1 | 2/2010 | Nam | |
| 2010/0044719 A1 | 2/2010 | Yu et al. | |

OTHER PUBLICATIONS

Zang et al., "Defect reduction by periodic SiNx interlayers in gallium nitride grown on Si (111)", J. Appl. Phys. 101, (2007); pp. 093502-093502-4.

Cheng et al., "Flat GaN epitaxial layers grown on Si(111) by metalorganic vapor phase epitaxy using step-graded AlGaN intermediate layers", Journal of Electronic Materials, 2006, vol. 35, Issue 4, pp. 592-598.

Sakai et al., "Reduction of the bowing in MOVPE AlGaN/GaN HEMT structures by using an interlayer insertion method", Physica Status Solidi (c), vol. 0, Issue 7, Dec. 2003, pp. 2412-2415.

Zhang et al., "Epitaxial lateral overgrowth of GaN by HVPE and MOVPE", SPIE Proceedings, vol. 4580, Jan. 1, 2001, pp. 214-220.

Tanaka et al., "Anti-Surfactant in III-Nitride Epitaxy—Quantum Dot Formation and Dislocation Termination-", Jpn. J. Appl. Phys., vol. 39, No. 8B, part 02, (2000), pp. L831-L834.

Great Britain Search Report, GB Application No. 1019301.9, dated Mar. 16, 2011, 3 pages.

International Search Report, PCT/GB2011/001474, dated Dec. 19, 2011, 4 pages.

Written Opinion, PCT/GB2011/001474, dated Dec. 19, 2011, 9 pages.

* cited by examiner

US 9,142,723 B2

SEMICONDUCTOR WAFER COMPRISING GALLIUM NITRIDE LAYER HAVING ONE OR MORE SILICON NITRIDE INTERLAYER THEREIN

REFERENCE TO RELATED CASES

This application is a U.S. national stage application of International Patent Application No. PCT/GB2011/001474, filed Oct. 12, 2011, and claims the benefit of Great Britain Application No. GB1019301.9, filed Nov. 15, 2010, the entire disclosures of which are incorporated herein by reference.

FIELD OF THE INVENTION

The present invention relates to a semiconductor material and the use of a semiconductor material in wafer-form for forming a light emitting diode (LED) or other optoelectronic device. Further, the present invention relates to a method of constructing high quality optoelectronic devices using the wafer. In particular, the present invention relates to an improved LED having a silicon substrate that minimises the dislocation-defects and wafer bow/cracking when large support wafers are used.

BACKGROUND OF THE INVENTION

Optoelectronic devices are well known and it is also known that for such devices it is desirable to minimise the occurrence of defects in the semiconductor layers that form part of the structure of the device. Common defects in LEDs, for example, include threading (edge or screw type) dislocations which lead to a reduced luminescent efficiency in the final product. The efficiency reduction can, at least in part, arise due to non-radiative recombination that can occur at dislocations and defects. These defects reduce the internal quantum efficiency (IQE) of the device.

One cause of such dislocations, as discussed in WO2006/014472, is lattice mismatches between dissimilar layers. Dislocations can arise simply due to different lattice parameters and/or due to thermal contraction at different rates following thermal growth techniques. One way to reduce the dislocation density is to rely on the growth of interlayers, as described in US2002/0069817. The technique described in US2002/0069817 relies in part on the growth of a thick layer of GaN.

A consequence of the mismatched lattice parameters and thermal expansion coefficients, particularly where the difference lies between the substrate and the overlying layers, is a high degree of curvature that is introduced into the wafer by the mismatch. This curvature affects the size of wafer that can be manufactured or leads to wafers with high defect levels.

If an overlying layer has a significantly larger thermal expansion coefficient than the substrate, the overlying layer would be in tension. This can lead to crack formation. For LED structures, where a GaN layer is preferably n-type doped, the doping adds additional tensile stress to the structure. As a consequence, stress management is critical, especially where Si substrates are used.

Several methods have been proposed to address the issue of tensile stress and associated curvation and/or cracking. Methods include the use of patterned substrates to guide the cracks in masked or etched parts of substrates, the use of compliant substrates, or the insertion of low-temperature AlN interlayers. US2010/0032650 discusses some of these techniques. It is, however, considered that to make, for example, GaN-based LEDs on Si substrates by a low-cost route, extra procedures such as ex-situ patterning before growth are not preferred, and a method is required that gives simultaneously crack-free layers, a low threading dislocation and a flat wafer.

SUMMARY OF THE INVENTION

The present invention seeks to address at least some of the problems associated with the prior art, or to provide a commercially useful alternative thereto.

According to a first aspect, the present invention provides a semiconductor wafer comprising:
a substrate layer; and
a first GaN layer having one or more $SiN_x$ interlayers therein; and
wherein in the first GaN layer at least one $SiN_x$ interlayer has GaN penetrated through one or more portions of said $SiN_x$ interlayer and said interlayer preferably has a thickness of from 0.5 to 10 nm.

Figure 1:
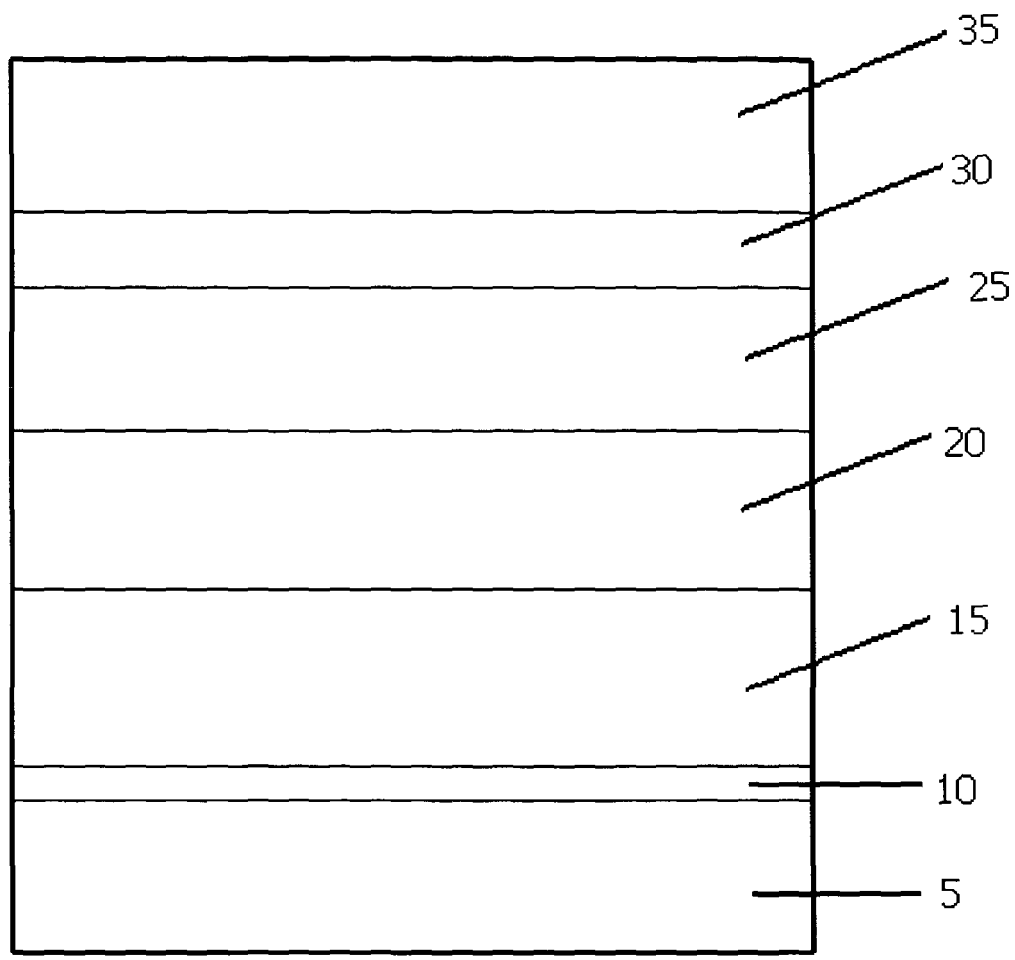
FIG. 1 shows an example of the layer structure of an LED manufactured according to the present invention.

| Letter | Label |
| --- | --- |
| A | Mg-doped GaN layer |
| B | InGaN/GaN MQW |
| C | Si-doped GaN layer |
| D | Nid-doped GaN layer |
| E | AlGaN buffer layer |
| F | AlN nucleation layer |
| G | Si substrate |
| H | 3 dimensional GaN |
| I | $SiN_x$ interlayer (IL) |

DETAILED DESCRIPTION OF PREFERRED EMBODIMENTS

The present invention will now be described further. In the following passages different aspects/embodiments of the invention are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

By semiconductor wafer, a term in the art, is meant a composite laminar body comprised of at least some semiconductor material. That is, a layered material as described herein. In general terms it is a wafer on which electrical contacts may be provided or formed in the formation of an electronic device, preferably an optoelectronic device. Wafers are well known in the art.

The substrate can be any conventional substrate for forming a semiconductor wafer. Suitable substrates include sapphire and SiC, as well as any silicon containing substrate.

Preferably the substrate consists essentially of silicon and unavoidable impurities. The use of silicon substrates is especially cost effective but using conventional structures can lead to high levels of defects.

As used herein, the term "on" with respect to two layers includes the layers being in direct contact as well as having one or more layers there-between. The terms "above" or "below" as used herein are relative to a laminar structure wherein the substrate is considered to be the lowest layer. Thus, if a first layer is above a second layer, this means the first layer is on the opposite side of the second layer from the substrate. The terms "above" or "below" as used herein does not require the first and second layers to be in direct contact with each other. The term "in", as used herein with respect to the SiNx interlayers, includes the provision of the interlayer at the upper or lower surface of the first GaN layer, with the proviso that the GaN of the first layer penetrates through one or more portions of that interlayer.

To determine the thickness of the layers disclosed herein, X-ray diffraction (XRD) is the preferred non-destructive technique that can be used for complete wafers. This technique allows the structural parameters to be determined from the XRD diffraction pattern obtained. More precise values can be obtained by transmission electron microscopy (TEM). This technique requires the preparation of samples from the wafer and so cannot be used if the sample is intended for subsequent processing. Both techniques are well known in the art. The techniques are discussed in "Interlayer methods for reducing the dislocation density in gallium nitride" by M Kappers et al (Physica B 401-402 (2007) 296-301), for example.

As used herein, any reference to a species by its constituent components includes all available stoichiometries thereof. Thus, for example, AlGaN includes all alloys thereof, such as $Al_xGa_{(1-x)}N$ wherein x does not equal 1 or 0. Preferred stoichiometries will vary depending on the thickness of the layer required.

The present inventors discovered that the thickness of crack-free GaN layers that can be grown on a silicon substrate is limited and a substantial number of threading dislocations are present in such GaN layers. Furthermore, the inventors realised that any attempt to n-type dope the GaN layer or to include a further n-doped GaN layer on a first GaN layer exacerbates this problem.

The first GaN layer introduces compressive stress into the structure. The SiNx interlayers, preferably formed extending across the plane of the substrate, serve to reduce the occurrence of threading dislocations within the GaN layer. When thicker layers of GaN are grown without the interlayers of SiNx, it is found that a high density of dislocations exists, rendering the wafer less useful for optoelectronic devices.

$SiN_x$, as referred to herein, indicates the deposit of a layer of Silicon and Nitrogen. X may have a value from ½ to 2 depending on the composition desired. The layer is preferably formed from silane and ammonia gas. Preferably the ratio of silane/hydrogen to ammonia in SCCM (standard cubic centimeters per minute) is from 1:50 to 1:200, where the silane is diluted with hydrogen gas to 50 ppm. This corresponds to a ratio of partial pressures of ammonia to silane in the growth chamber within the range $1 \times 10^6$ to $4 \times 10^6$. The silane may, for example, be diluted before mixing with hydrogen gas to 50 ppm. Suitable interlayers are described in "Interlayer methods for reducing the dislocation density in gallium nitride" by M Kappers et al (Physica B 401-402 (2007) 296-301), incorporated herein by reference.

The present inventors have now discovered a new method for forming a GaN layer to reduce the formation of the undesirable threading dislocations. By growing a thin layer of SiNx, subsequently deposited GaN can be made to grow through or penetrate the SiNx layer in one or more localised portions. That is, the SiNx layer is not continuous (it is a discontinuous interlayer) but is interrupted by portions of GaN. This localised growth leads to three dimensional domains (or crystals) of GaN protruding above the SiNx layer (relative to the substrate). While not wishing to be bound by theory, when the rest of the first GaN layer is formed around these three dimensional domains, a proportion of the threading dislocations that form in the first GaN layer above the SiNx interlayer bend towards and terminate at the interface or facets between the three dimensional domains and the GaN layer. Thus, surprisingly, a thin layer of GaN can be formed above the SiNx layer having very few threading dislocations other than those that terminate at the above-mentioned interface. As a consequence, the first GaN layer of the present invention provides an ideal surface upon which further layers can be formed, such as, for example, an n-doped layer for an LED.

At least one SiNx interlayer preferably has a thickness of from 0.5 to 10 nm. The inventors have discovered that this thickness of interlayer is sufficient to result in the subsequent localised growth of three dimensional GaN domains, while allowing the GaN to penetrate through the interlayer sufficiently. Without wishing to be bound by theory, it is speculated that the use of a SiNx interlayer of from 0.5 to 10 nm results in the optimum number and distribution of the 3D domains (and hence interfaces and facets) to minimise the threading dislocation defects. If the interlayer is too thick then the GaN may not penetrate the layer, whereas a sufficiently thick interlayer is required to ensure the desired localised structures.

In other words, the present inventors have discovered that they can provide a GaN layer on even a mismatched substrate, where the upper portion of the GaN layer has a reduced number of threading dislocations. This is the result of using one or more thin SiNx interlayers within the GaN layer (i.e. below the upper portion) and having GaN penetrate through the interlayer in isolated portions so as to introduce three-dimensional GaN structures above the interlayer. Without wishing to be bound by theory, it is believed that the presence of these three dimensional structures (or facetted islands) provides an interface whereby threading defects form half loops after reacting with other threading defects having an opposite Burgers vector. Thus the number of defects close to the SiNx interlayer is high, but the GaN layer above the interlayer then has fewer threading defects.

Preferably at least the $SiN_x$ interlayer that is furthest from the substrate layer has a thickness of from 0.5 to 10 nm (more preferably 2 to 8 nm, more preferably about 5 nm) and has GaN penetrating through one or more portions thereof. The use of this novel structure near the upper edge of the first GaN layer provides an upper surface of the first GaN layer exhibiting a reduced number of threading dislocations. Accordingly, subsequently grown layers will also benefit from a reduced occurrence of these dislocations.

In one embodiment the first GaN layer has two or more $SiN_x$ interlayers therein. The presence of multiple interlayers helps to reduce the occurrence of threading dislocations. However, the inventors have discovered that the use of a single layer allows for significant threading dislocation reduction without requiring more complex structure design.

Preferably GaN penetrates through one or more portions of at least one $SiN_x$ interlayer to form discrete crystalline structures within the GaN enclosing the $SiN_x$ interlayer. That is, the GaN preferably extends through and beyond the interlayer. This is, therefore, a discontinuous SiN$_x$ interlayer. This provides a greater interface between the penetrating GaN and the upper portion of the first GaN layer. This provides a greater area over which threading dislocations can form half loops as discussed above.

Preferably the GaN penetrates through a plurality of portions of said SiN$_x$ interlayer across said interlayer. That is, the SiNx layer is penetrated in a substantially even distribution across the layer. This leads to a final wafer having more predictable and useful properties. Preferably each portion of the SiNx interlayer that is penetrated has a cross-sectional area in the plane of the SiNx interlayer of at most 5 μm$^2$ and more preferably at most 1 μm$^2$. The cross-sectional area is preferably at least 1 nm$^2$.

Preferably the wafer further comprises an n-doped semiconductor layer and/or a p-doped semiconductor layer formed on the already-described wafer structure, i.e. on the first GaN layer. Where both n- and p-doped layers are included, one layer is on the other and both are on the GaN layer of the wafer. Preferably the n-doped layer is closest to the GaN layer. When both of these layers are present then a conventional optoelectronic device, such as an LED, can be formed. Suitable n- and p-doped layers are well known in the art.

A preferred n-doped layer is silicon or germanium doped GaN. Were a silicon-doped GaN layer to be formed directly on a silicon substrate, due to the high tensile stress introduced by the silicon doping, it would be practically impossible to grow a useful thickness of this low dislocation density n-doped layer without cracking. The wafer of the present invention addresses this problem and allows the growth of such a layer on a silicon substrate with reduced cracking and dislocations in the n-doped layer.

A more preferred n-doped semiconductor layer comprises a compositionally graded Si- or Ge-doped GaN layer formed on the GaN layer so that the amount of Si or Ge respectively increases across the thickness of the layer away from the first GaN layer. That is, there is substantially no silicon doping in the layer directly adjacent to the GaN layer, and the level of Si-doping increases across the n-doped layer to a maximum at the opposite side from the GaN layer (at the n/p interface in a conventional LED). Preferably the level of doping varies from about $1 \times 10^{17}$ cm$^{-3}$ to about $1 \times 10^{19}$ cm$^{-3}$. More preferably the level of doping varies from about $1 \times 10^{18}$ cm$^{-3}$ to about $8 \times 10^{18}$ cm$^{-3}$.

The wafer may further comprise an AlGaN layer between the substrate and the first GaN layer. This advantageously helps controls the stress introduced into the semiconductor wafer and allows, for example, an overlying LED structure to be formed on a substrate while minimising the defects that would otherwise be formed. This layer serves to address a large lattice and thermal expansion coefficient mismatch between, for example, Si and GaN, which would result in a high dislocation density and cracking in epitaxially grown GaN, limiting the performance of such LED structures. Due to its lattice parameters, the AlGaN interlayer is particularly useful for addressing the mismatch between Si and GaN.

Preferably there is an AlN layer formed between the substrate layer and the AlGaN layer. This advantageously acts as a nucleation layer to encourage the growth of the AlGaN layer and encourages strong connection of this layer to the substrate. Furthermore, the layer prevents reaction between the overlying layer (in particular the gallium content) and the substrate, especially when the substrate is silicon.

Preferably the AlGaN layer is compositionally graded so that the concentration of aluminium decreases across the thickness of the layer away from the silicon substrate layer.

Thus, the values of x in Al$_x$Ga$_{(1-x)}$N preferably decrease from at least 0.9 to 0.1 and preferably from 1 to 0 across the layer. Preferably the value of x decreases from 0.9 to 0.3 away from the substrate-side of the layer. Preferably the decrease is linear, although non-linear or stepwise decreases in the aluminium content are also possible. The use of the compositional grading, whereby the amount of aluminium decreases across the layer, serves to reduce the lattice mismatch between the GaN layer and the substrate. Where an AlN nucleation layer is used, this further serves to improve the bonding between layers and to introduce compressive stress into the AlGaN buffer layer.

In an alternative embodiment, the structure comprises two or more AlGaN layers between the substrate layer and the first GaN layer, wherein each layer has the formula Al$_x$Ga$_{1-x}$N and the value of x in each layer is a value from 0.01 to less than 1, preferably from 0.01 to 0.9, more preferably from 0.01 to 0.5. More preferably, the value of x in each layer is different and preferably is from 0.01 to 0.9, more preferably from 0.01 to 0.5 and most preferably from 0.05 to 0.3. In a preferred embodiment the values of x in the two or more AlGaN layers differ by from 0.5 to 0.1; for example, a first layer may have a value of x=0.25 and a second may have a value of x=0.75. Preferably the layers are arranged so that the values of x across the layer and hence the concentration of aluminium decreases across the thickness of the layer away from the silicon substrate layer.

When forming a wafer, particularly using methods of deposition at high temperatures (such as MOCVD), a large tensile/compressive stress (depending on the substrate) is introduced into the film upon cooling from the growth temperature because of large thermal expansion mismatches (for example, it has been found that there is a 46% mismatch between a Si substrate and a GaN layer). The AlGaN layer, if present, helps prevent wafer bowing and/or cracks, which otherwise make processing difficult and impair device performance. As the substrate size is scaled up, the requirement of wafer flatness becomes stricter due to the limited tolerance in wafer bow for processing a full wafer. For example, with a 50 μm wafer bow limit, the radius of curvature has to be larger than 6 m for a 2-inch wafer but in excess of 57 m for a 6-inch wafer.

Preferably the substrate comprises silicon and, preferably, the substrate is silicon (i.e. consists of silicon with unavoidable impurities). The present inventors have discovered that the technique and wafer of the present invention is of particular use when the substrate is silicon. The reduced thickness of GaN layers required to be fully coalesced when using the SiNx interlayers serves to address the problems of wafer bowing and/or cracking.

Preferably the first GaN layer is not doped or at least not intentionally doped. This serves to form an insulating region between any n-doped layers formed thereon and the more defective lower layers. It is especially preferred that the GaN of the first layer that penetrates the SiNx is not doped. It is further preferred that the GaN of the first layer that is formed around the GaN that penetrates the SiNx interlayer is not doped. This helps to prevent n-type carrier loss and increases the efficiency of a final device. In an alternative embodiment, where a thinner structure is preferred, the first GaN layer may be doped, for example with Si, and have a gradient doping so that the doping at the substrate-surface side is zero and the doping increases across the layer (for example, up to a doping level of $4 \times 10^{18}$ cm$^{-3}$). The doping gradient is preferably linear but may, for example, be stepwise.

In one embodiment the first GaN layer contains Al. This helps to reduce the occurrence of dislocations by reducing the lattice mismatch between a substrate and the overlying structure. Preferably the first GaN layer may then be an $Al_xGa_{1-x}N$ layer as described herein. The value of x in the layer is preferably from 0.01 to 0.5. More preferably, the value of x in each layer is from 0.05 to 0.3.

Where the wafer further comprises an n-doped semiconductor layer and/or a p-doped semiconductor layer formed on the wafer, the structure preferably further comprises a layer of multiple quantum wells formed between the n-doped semiconductor layer and a p-doped semiconductor. This is a known technique for increasing the efficiency of an LED and can advantageously be used in combination with the inventive wafer.

Preferably the thickness of the substrate is from 100 to 2000 microns, more preferably from 275 to 1000 microns. These substrates can be obtained commercially. A preferred example is a 6 inch Si substrate of 625 microns from SEH Ltd™. For practical reasons of semiconductor device design it is not desirable to have an overly thick substrate. However, if the substrate is too thin then the final device may be insufficiently strong.

Preferably the thickness of the first GaN layer is from 0.1 to 5 μm, including the thickness of the SiNx interlayer or interlayers. More preferably the layer is from 600 to 1200 nm. The thicker the layer that is formed the more likely it is to crack. However, a sufficient thickness is required to provide a suitable support for forming, for example, the n-/p-doped layers of an optoelectronic device thereon. The structure of the present invention allows for thicker crack free layers to be formed.

Preferably the thickness of each SiNx interlayer is from 0.1 to 50 nm, more preferably 0.5 to 10 nm and more preferably from 2 to 8 nm. Preferably, at least one interlayer is from 0.5 to 10 nm. These thin interlayers allow the GaN to penetrate through. Interlayers of 0.1 to <0.5 nm and >10 nm to 50 nm may be included, but do not exhibit the same threading dislocation reduction effect as interlayers of from 0.5 to 10 nm.

Preferably the thickness of the AlGaN layer, where present, is from 100 to 1500 nm and more preferably from 200 and 800 nm. This thickness is sufficient to reduce the wafer curve and address the issues of lattice parameter mismatch. If the layer is too thin then these benefits may not be maximised. Where several layers are present the total combined thickness of the layers is from 100 to 1500 nm and more preferably from 200 and 800 nm.

Preferably the thickness of each AlN layer, where present, is from 5 to 400 nm, more preferably from 10-300 nm. If the layer is thinner then Gallium in the first GaN layer may react with the silicon substrate. Beyond the upper limits the benefits of this nucleation layer do not increase and the overall thickness of the structure is undesirably increased.

Preferably the thickness of each n-doped semiconductor layer, where present, is from 50 to 2000 nanometers, more preferably from 400 to 1000 nanometers. This applies equally to a Si- or Ge-doped GaN layer. The layers require a certain thickness to be functional, but if the layer is thicker then the likelihood of cracking is too great.

Preferably the thickness of each p-doped semiconductor layer, where present, is from 50 to 1500 nanometers, more preferably from 100 to 600 nanometers and more preferably from 100 to 200 nanometers. P-type semiconductor layers are well known in the art. Mg doping is preferred. The layers require a certain thickness to be functional, but if the layer is thicker then the likelihood of cracking is too great.

According to a second aspect, the present invention provides an LED comprising the semiconductor wafer described herein. The semiconductor wafer is especially suited to forming an LED due to the low occurrence of threading dislocations that can be achieved. This increases the IQE of the LED. Furthermore, where larger substrates can be used the costs of processing is significantly reduced which is essential for reducing the cost of this fast developing technology.

According to a third aspect, the present invention provides a solar cell comprising the semiconductor wafer described herein. The solar cell shares the benefits associated with the LED of the present invention.

Preferably the invention relates to single wafers for the production of a plurality of optoelectronic devices. Such a wafer may be quickly and easily produced to minimise production costs. Preferably such a wafer would have a diameter of at least 5 cm, preferably greater than 15 cm. and preferably up to 30 cm. More preferably the wafer is at least 6 inches, preferably at least 8 inches, preferably at least 10 inches at most preferably at least 12 inches. In one embodiment, wafers of <6 inches are preferred. In one embodiment, wafers of ≥6 inches and <8 inches are preferred. In one embodiment, wafers of ≥8 inches and <10 inches are preferred. In one embodiment, wafers of ≥10 inches and <12 inches are preferred. In one embodiment, wafers of ≥12 inches are preferred. Thus, the wafer can be produced on a large scale. Due to the layers of the present invention the wafer curvature is minimised and larger wafers can be used for increased efficiency. The wafers produced can be divided up to form individual optoelectronic devices, such as LEDs. For solar cells, in one embodiment, advantageously the wafer is not divided up, but rather substantially the entire wafer is used to form a solar cell.

In a particularly preferred embodiment, there is provided a semiconductor wafer comprising:
 a substrate layer formed of Si; and
 a first GaN layer having one or more $SiN_x$ interlayers therein; and
 wherein in the first GaN layer at least one $SiN_x$ interlayer having a thickness of from 0.5 to 10 nm, and wherein GaN penetrates through one or more portions of said $SiN_x$ interlayer, there being one or more AlGaN layer between the substrate layer and the first GaN layer and preferably further comprising an AlN layer between the substrate layer and the AlGaN layer (closest to the substrate). The thickness of the AlN layer, where present, is from 10-300 nm; and the thickness of the AlGaN layer, where present, is from 100 to 1500 nm, preferably from 200 to 800 nm. Silicon substrates have significant lattice mismatch and yet provide a commercially useful alternative for semiconductor devices compared to other known substrates. The present inventors have discovered that the use of at least one $SiN_x$ interlayer and an AlGaN layer serve to minimise the formation of defects and allow the production of high efficiency devices. Preferably the AlGaN layer is continuously graded from 0.9 to 0.3. Preferably the wafer further comprises an n-doped layer as described herein and/or the first GaN layer is Si doped as described herein.

According to a fourth aspect the present invention provides a semiconductor device comprising a semiconductor wafer as defined herein.

According to a fifth aspect, the present invention provides a process for forming a composite wafer as described herein, wherein the layers are sequentially formed on the substrate using metalorganic vapour phase epitaxy (MOVPE) growth procedure. MOVPE is a well known technique and its use to form layers on a substrate is well known. Advantageously, the semiconductor wafer and, optionally, any further layers, can be formed using a single process. This simplifies the manufacturing process and reduces the complexity and cost of producing optoelectronic devices.

Preferably, after the formation of one of said $SiN_x$ interlayers, GaN is deposited so that said GaN penetrates through one or more portions of said SiNx interlayer. The GaN is preferably deposited by using a temperature of from 900 to 1050° C. and a V/III ratio (i.e. N:Ga: the ratio of nitrogen to gallium molar flow rates or partial pressures) of less than 1000:1. Advantageously, the pressure is also increased in accordance with normal MOVPE practice to encourage the penetrating growth as truncated hexagonal islands having facets to provide the interfaces discussed above.

Furthermore, the MOVPE procedure is preferably carried out in a single chamber and/or in a single process for at least the growth of two layers and preferably for the entire device. Accordingly, to grow each layer in turn, new ingredient components are simply introduced into the growth chamber sequentially.

Preferably, once the penetrating GaN has been grown, the rest of the first GaN layer is allowed to coalesce by increasing the temperature and increasing the V/III ratio above 1000:1, preferably to at least 2000:1. The increased temperature is preferably above 1050° C.

The temperatures required for the growth of each layer can be determined with minimal experimentation. In general terms, it is advantageous to grow the layers at a lower temperature than the optimal growth temperature so as to allow closer control on the layer composition and thickness. By way of example, GaN layers can be grown around 1020° C. and SiNx layers around 950° C.

According to a sixth aspect, the present invention provides the use of a GaN layer having one or more $SiN_x$ interlayers therein, applied to a substrate, having GaN penetrating through one or more portions of said $SiN_x$ interlayer, to reduce the threading dislocation density in layers formed thereon.

Example 1

In this embodiment GaN structures are grown on either 2-inch or 6-inch Si (111) substrates 5 by metalorganic vapour phase epitaxy (MOVPE) in a 6×2" Aixtron CCS reactor using a 6×2" or 1×6" susceptor. Trimethylgallium (TMG), trimethylaluminium (TMA) and trimethylindium (TMI) were used as group-III precursors, while ammonia was used as the nitrogen source. Silane (SiH4) and cyclopentadienyl magnesium ($Cp_2Mg$) are used as the sources of n-type and p type dopants, respectively.

A flat, crack-free and uniform GaN-based LED structure was grown on 6-inch Si (111) substrate 5 by metal-organic vapour phase epitaxy (MOVPE). The as-supplied Si (111) substrates 5 were first annealed in the reactor to remove the native oxide layer.

This was followed by the growth of an AlN nucleation layer 10 which prevents Ga from reacting with the Si substrate. An AlGaN buffer layer 15 was then grown to control the stress. The AlN nucleation layer 10 and graded AlGaN buffer layer 15 were employed for stress management, giving wafers with a radius of curvature>60 m for a total LED structure thickness of 2.5 µm. To reduce the dislocation density, an in-situ SiNx interlayer (not shown) was grown within the GaN layer 20 by partial deposition of the GaN layer 20, growing the interlayer and then completing the GaN layer 20. The temperature was decreased to 950° C. for the deposition of the SiNx interlayer and regrowth started at 970° C. to form faceted islands, and then changed to 1050° C. for slow growth of the GaN layer to coalesce the film. After the film was fully coalesced, the growth conditions were set for a faster GaN growth.

After that, a Si-doped GaN layer 25 with thickness of 1 µm was grown. For LED structures, the growth temperature was then reduced and a $N_2$ atmosphere used for the growth of the multiple quantum well (MQW) active region 30. The Mg-doped GaN capping layer 35 was deposited in a $H_2$ ambient. After the growth, in-situ annealing was carried out in a $N_2$ atmosphere to activate the acceptors.

After growth the structures were characterised using a PANalytical MRD high resolution X-ray diffractometer and a Philips CM30 TEM operating at 300 kV. A Digital Instruments Dimension 3100 atomic force microscope (AFM) was used to study the surface morphology. The wafer surface features were also examined using a graphic-EYE whole-wafer optical imaging system to show any surface cracks and roughness. The wafer curvature across the whole wafer and surface height were measured ex-situ using a KSA multi-beam optical sensor (MOS) Ultrascan™ instrument. PL and thickness maps were collected using an Accent RPM2000 PL mapping system.

This example was repeated and the following structures were produced.

| Layer | Example A | Example B | Example C |
|---|---|---|---|
| Silicon substrate | 625 µm | 625 µm | 625 µm |
| AlN nucleation layer | 200 nm | 200 nm | 300 nm |
| $Al_xGa_{1-x}N$ stress control layer | 800 nm | 680 nm | 1300 nm |
| $Al_xGa_{1-x}N$ composition | 0.88 < x < 0.3 | 0.88 < x < 0.3 | 0.88 < x < 0.3 |
| GaN lower layer | 220 nm | 200 nm | 400 nm |
| GaN upper layer | 200 nm | | |
| Doped GaN first layer | 800 nm | 550 nm | 1100 nm |

| Layer | Example D | Example E |
|---|---|---|
| Silicon substrate | 625 µm | 625 µm |
| AlN nucleation layer | 200 nm | 200 nm |
| $Al_xGa_{1-x}N$ stress control layer | 700 nm | AlGaN1 (120 nm)<br>AlGaN1 (200 nm)<br>AlGaN1 (220 nm)<br>AlGaN1 (300 nm) |
| $Al_xGa_{1-x}N$ composition | 0.88 < x < 0.2 | AlGaN1 (x = 0.75)<br>AlGaN1 (x = 0.60)<br>AlGaN1 (x = 0.42)<br>AlGaN1 (x = 0.30) |
| GaN lower layer | 480 nm | 300 nm |
| GaN upper layer | 200 nm | 0 |
| Doped GaN first layer | 1300 nm | 1100 nm |

The thickness of the $Al_xGa_{1-x}N$ stress control layer in each example was chosen to ensure a flat crack-free final wafer. This thickness can depend to some extent on the thickness of the substrate, the thickness of the AlN nucleation layer and the thicknesses of the various GaN layers, both doped and undoped.

In examples A-C the composition of the $Al_xGa_{1-x}N$ layer varies linearly with distance from the nucleation layer, with x decreasing from 0.88 at the interface with AlN to 0.3 at the interface with the GaN layer. Similarly, in example D x decreases from 0.88 at the interface with AlN to 0.2 at the interface with the GaN layer. In example E the $Al_xGa_{1-x}N$ is formed in discrete layers with different values of x. In examples A and D, a single SiNx interlayer was used between the GaN lower layer and the GaN upper layer. In examples B, C and E, a single SiNx interlayer was used between the GaN lower layer and the doped GaN layer. The silicon doping in the doped GaN layers had a constant value of $4\times10^{18}$ $cm^{-3}$ on the top surface. The SiNx interlayer in each example had a thickness of about 2.5 nm.

The LED wafers could be characterised using X-ray diffraction (XRD), atomic force microscopy (AFM), transmission electron microscopy (TEM), photoluminescence (PL), ex-situ wafer curvature mapping and optical imaging techniques. Such techniques are well known in the art and a skilled man could select and employ the appropriate techniques to measure all of the layer thicknesses disclosed herein.

Example 2

Figure 2:
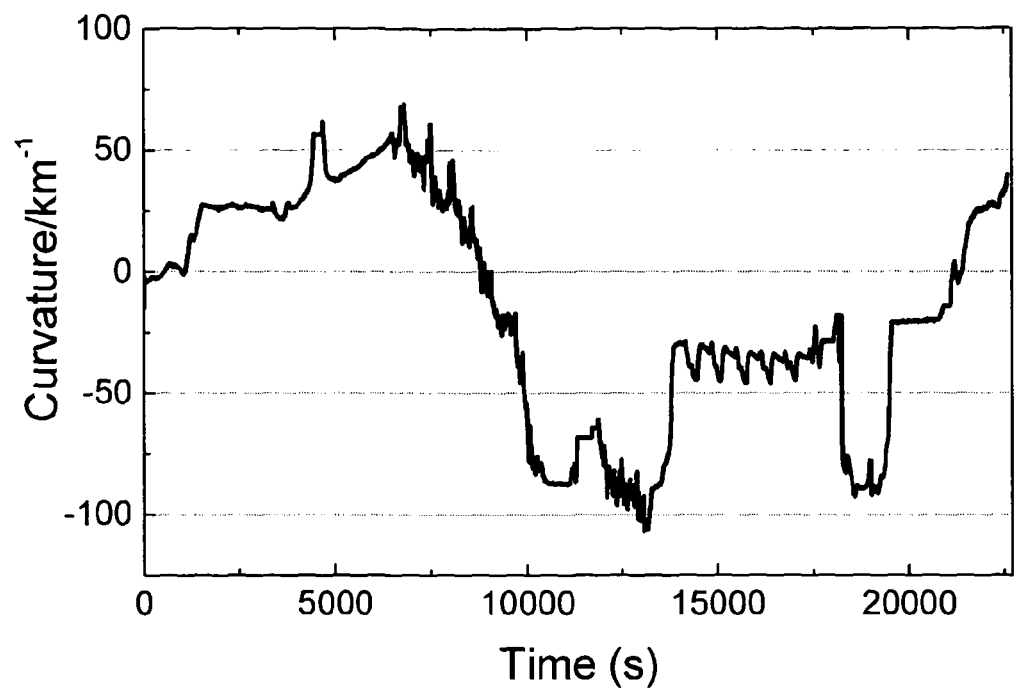
FIG. 2 shows a graph of the curvature of the wafer of the invention during the growth of the various layers required to form an LED. The x-axis shows the time in seconds. The Y-axis shows the curvature in $km^{-1}$.
Figure 3:
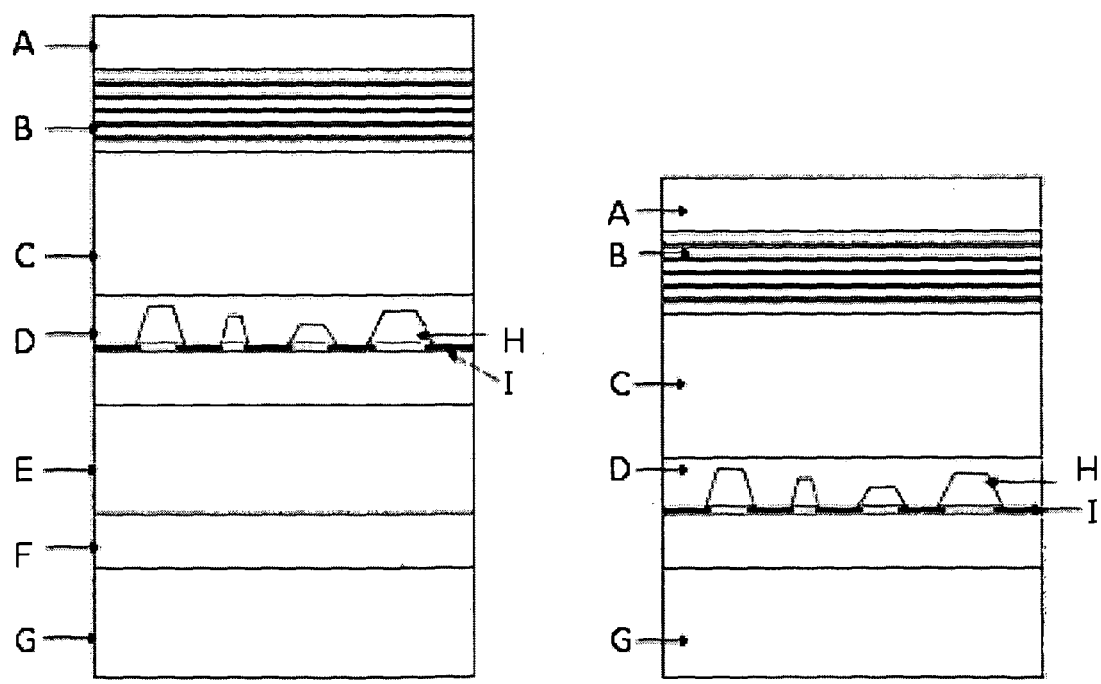
FIG. 3 shows two examples of the layers of the LED showing a SiNx interlayer, penetrating GaN and n-type GaN. It will be appreciated that these examples are not limiting on the scope of the invention. Further layers or replacement layers may be included in other examples of the invention. The following key applies to the labels shown in FIG. 3.

A commercially available Epicurve®TT sensor (Laytec GmbH) was used to give emissivity-corrected real-time temperature and wafer curvature measurement and an Argus (Aixtron) in-situ temperature profiler was installed on top of the reactor to provide a complete temperature map of the wafer. FIG. 2 shows a trace of the curvature of the wafer during the manufacturing process for a wafer.

As can be seen in FIG. 2, the curvature of the wafers varies throughout the process.

Between 1000s and 3000s the substrate was annealed and plateaued at 25/km. Then a 200 nm AlN nucleation layer was formed which increased the concave form of the wafer. At 7500s the AlGaN buffer layer was formed, and then a GaN layer containing a single interlayer to a total thickness of 1.3 µm. At 12500 a Si-doped GaN layer was formed. Between 14000s and 18000s InGaN—GaN multi quantum wells (MQW) were formed before the wafer composite was allowed to cool. During cooling the curvature dropped from −150/km to +25/km.

From the curvature data, it is clearly seen that the wafer bow changes during the growth as a function of the thicknesses of the various layers. It is evident that compressive stress has been introduced during the growth of the AlGaN buffer layer and Si-doped GaN layer, changing the wafer bow from concave to convex. Flat wafers are achieved at room temperature by this tensile stress compensation method.

The preferred MOVPE reactor is a 6×2" CCS-MOCVD reactor with an Aixtron Argus installed. The Argus comprises a multi-element photodiode array in a novel configuration that utilizes an optical path through the reactor showerhead injection tubes. This allows a large number of discrete measurement points from which temperature data regarding wafer and susceptor surfaces can be acquired. Essentially, this allows the measurement of the surface temperature across the whole wafer during growth.

From the in-situ curvature data, it is possible to see from the wafer bow where the wafer to substrate separation is increasing, and so where the temperature of the wafer will decrease. During growth the heater zone settings can then be adjusted to maintain a flat temperature profile. The PDA data is used to confirm that the resulting temperature profile across the wafer is flat. Temperature uniformity during growth is important to maintain the uniformity of the LED wavelength and intensity and to minimise slip in the Silicon.

The growth of GaN on Si substrates usually starts with an AlN nucleation layer, to prevent Ga from reacting with Si and causing melt-back etching. A TMA pre-dose is a widely used method for the deposition of AlN to protect the Si substrate from nitridation, although it is found that the quality of the AlN nucleation layer is strongly affected by the growth temperature, the TMA pre-dose time and the thickness of the nucleation layer. The layer of AlN is desired to coalesce to great degree, showing a smooth surface with a root mean square (RMS) roughness ~0.5 nm for a 25 µm$^2$ area. A smooth (RMS roughness less than 1 nm) AlN surface minimizes the crystal misorientation and reduces the cracking density in the subsequent GaN layer.

Due to the larger in-plane lattice parameter of GaN compared to AlN, a GaN or AlGaN layer will be under compression when grown on AlN. This compressive stress in the (Al)GaN layer can be used to bend the Si wafer at the growth temperature to compensate for the wafer bow which will occur as a result of the tensile stress (arising from the large difference in thermal expansion coefficient between GaN and Si) during cooling to room temperature. The Al fraction in the AlGaN buffer layer can be either step-graded or continuously graded and both cases were found to be effective in terms of the introduction of compressive stress at growth temperatures.

AlN deposition causes tensile stress, which increases with film thickness, possibly due to the layer coalescence. Similarly, thicker AlGaN buffer layers (at least up to 1.3 µm) introduce more compressive stress, enabling the growth of a thicker crack-free GaN layer. The optimised AlGaN buffer layer thickness depends on the thickness of the GaN layer required.

Because of the large lattice mismatch between Si and AlGaN, GaN structures grown on Si substrates usually have a high initial dislocation density, which is undesirable for high performance devices. The difficulty of achieving low dislocation density for GaN on Si arises not only from the large lattice mismatch, but also due to the limited thickness of crack-free GaN that can be grown. To reduce the dislocation density, one or more SiNx interlayers (IL) can be incorporated into the GaN layer.

Usually, a greater reduction in the threading dislocation (TD) density can be achieved by using thicker SiNx interlayers and longer coalescence times for the subsequent GaN layer on top of the interlayer. However, the challenge of using this TD reduction method for growth on Si is the limited thickness of crack-free GaN that can be deposited, while maintaining a low wafer bow.

Example 3

A graded AlGaN buffer layer was grown on an AlN/Si template, followed by 300 nm thick GaN layer at 1020° C. The temperature was then decreased to 950° C. for the deposition of the SiNx interlayer and regrowth started at 970° C. to form faceted islands and then changed to 1050° C. for slow growth of the GaN layer to coalesce the film. After the film is fully coalesced growth conditions were set for faster GaN growth. The thickness of GaN required to fully coalesce the film after the deposition of SiNx depends on the deposition time of SiNx IL, as well as the growth conditions of the GaN regrowth on top. The TD density of approximately $6\times10^8$ cm$^{-2}$ was obtained together with flat crack-free wafers. Preferred TD densities are less than $5\times10^9$ cm$^{-2}$, more preferably less than $1\times10^9$ cm$^{-2}$, more preferably less than $8\times10^8$ cm$^{-2}$.

After the growth of the AlGaN buffer layer, nominally undoped GaN of 100-400 nm thick is grown, followed by the deposition of the SiNx interlayer and further GaN growth. The two GaN regions (~600 nm total) are kept nominally undoped to aid the coalescence of GaN film and also to prevent the introduction of additional TDs caused by Si-doping. The Si-doping profile of GaN was graded from low doping level to highly doped.

Advantageously, the present invention allows the growth of crack-free n-type GaN (<2 microns) of low dislocation density on Si substrates. Equally, such layers could be grown on other substrates, especially those where the difference in lattice parameters dictate that thicker layers would be prone to wafer bending and cracking of the n-doped layer.

Accordingly, the present invention enables a greater rate of threading dislocation reduction within the critical thickness to achieve device quality materials. As a consequence, the method reduces epitaxy growth time and epitaxy cost. In addition, since the further layers keep carriers away from defective regions (closer to the substrate and, in particular, around the GaN islands grown through the SiNx interlayer), a more reliable and higher efficiency LED device can be obtained.

Although preferred embodiments of the invention have been described herein in detail, it will be understood by those skilled in the art that variations may be made thereto without departing from the scope of the invention or of the appended claims.

The invention claimed is:

1. A semiconductor wafer havinq a diameter of at least 6 inches, comprising:
   a substrate layer consisting of silicon and unavoidable impurities;
   a first GaN layer having one or more $SiN_x$ interlayers therein;
   an AlGaN layer between the substrate layer and the first GaN layer; and
   an AlN layer between the substrate layer and the AlGaN layer;
   wherein the AlGaN layer is compositionally graded so that the amount of aluminum decreases across the thickness of the layer away from the silicon substrate layer; and
   wherein in the first GaN layer at least one $SiN_x$ interlayer has GaN penetrated through one or more portions of said $SiN_x$ interlayer and has a thickness of from 0.5 to 10 nm.

2. The semiconductor wafer according to claim 1, comprising two or more AlGaN layers between the substrate layer and the first GaN layer, wherein each layer has the formula $Al_xGa_{1-x}N$ and the value of x in each layer is from 0.01 to 0.9.

3. The semiconductor wafer according to claim 1, wherein the first GaN layer is not intentionally doped.

4. A semiconductor wafer according to claim 1, wherein the first GaN layer has two or more $SiN_x$ interlayers therein.

5. A semiconductor wafer according to claim 1, wherein GaN penetrates through one or more portions of at least one $SiN_x$ interlayer to form discrete crystalline structures within the GaN enclosing the $SiN_x$ interlayer.

6. A semiconductor wafer according to claim 1, wherein the GaN penetrates through a plurality of portions of said $SiN_x$ interlayer across said interlayer.

7. The semiconductor wafer according to claim 1, further comprising a second GaN layer on the first GaN layer, wherein the second GaN layer is intentionally doped.

8. The semiconductor wafer according to claim 7, wherein the second GaN layer is n-doped, preferably with silicon or germanium.

9. The semiconductor wafer according to claim 7, wherein the second GaN layer is a compositionally graded Si- or Ge-doped GaN layer formed on the first GaN layer so that the amount of Si or Ge respectively increases across the thickness of the layer away from the GaN layer.

10. The semiconductor wafer according to claim 7, further comprising a p-doped semiconductor layer formed on the second GaN layer.

11. The semiconductor wafer of claim 10, further comprising a layer of multiple quantum wells (MQWs) formed between the second GaN layer and the p-doped semiconductor layer, and wherein the thickness of the layer of MQWs is preferably from 10 to 200 nm.

12. The semiconductor wafer of claim 1 wherein:
   the thickness of the substrate is from 275 to 1000 μm; and/or
   the thickness of the AlN layer, where present, is from 10-300 nm; and/or
   the thickness of the AlGaN layer, where present, is from 100 to 1500 nm; and/or
   the thickness of the first GaN layer is from 0.1 to 5 μm; and/or
   the thickness of each SiNx interlayer is from 0.5 to 10 nm.

13. The semiconductor wafer of claim 1 incorporated into an LED or a Solar Cell.

14. A semiconductor device comprising a semiconductor wafer as defined in claim 1.

15. A process for forming a composite wafer according to claim 1, wherein the layers are sequentially formed on the substrate using metalorganic vapour phase epitaxy (MOVPE) growth procedure.

16. The process according to claim 15, wherein after the formation of one of said $SiN_x$ interlayers, GaN is deposited to penetrate through one or more portions of said SiNx interlayer.

17. The process according to claim 16, wherein the GaN deposited to penetrate through one or more portions of said SiNx interlayer is deposited at a temperature of from 900 to 1050° C. and a V/III ratio of less than 1000:1.

18. The process according to claim 16, wherein at least two or more of the layers are deposited in a single MOVPE process carried out in a single MOVPE chamber.

* * * * *